United States Patent
Sivertsen

(10) Patent No.: US 6,751,103 B1
(45) Date of Patent: Jun. 15, 2004

(54) RETAINER CLIP

(75) Inventor: Clas Sivertsen, Lilburn, GA (US)

(73) Assignee: American Megatrends, Inc., Norcross, GA (US)

( * ) Notice: Subject to any disclaimer, the term of this patent is extended or adjusted under 35 U.S.C. 154(b) by 0 days.

(21) Appl. No.: 10/384,341

(22) Filed: Mar. 7, 2003

(51) Int. Cl.$^7$ ............................................... H02B 1/01
(52) U.S. Cl. ...................... 361/825; 439/500; 429/100
(58) Field of Search ........................... 361/760, 801, 361/807, 825; 439/248, 366, 500; 429/96–100, 123

(56) References Cited

U.S. PATENT DOCUMENTS

| | | | |
|---|---|---|---|
| 4,487,820 A | * | 12/1984 | Engelstein et al. ......... 429/100 |
| 4,623,206 A | | 11/1986 | Fuller |
| 4,937,705 A | | 6/1990 | Piber |
| 5,047,044 A | | 9/1991 | Smith et al. |
| 5,108,889 A | | 4/1992 | Smith et al. |
| 5,782,867 A | | 7/1998 | Shrock et al. |
| 5,805,423 A | * | 9/1998 | Wever et al. .............. 361/760 |
| 5,876,241 A | * | 3/1999 | Frantz ...................... 439/500 |
| 6,152,581 A | | 11/2000 | Masters et al. |
| 6,326,558 B1 | * | 12/2001 | Maeda ...................... 174/260 |
| 6,351,099 B2 | | 2/2002 | Jones et al. |

* cited by examiner

Primary Examiner—David Martin
Assistant Examiner—Thanh S. Phan
(74) Attorney, Agent, or Firm—Merchant & Gould

(57) ABSTRACT

A retainer clip for holding a battery to an electronic device is disclosed. The retainer clip includes at least three arms that join together at an intersecting point. The intersecting point is urged toward the electronic device to which the retainer clip is coupled to hold more securely the battery in position. It is noted that this abstract is provided to comply with the rules requiring an abstract that will allow a searcher or other reader to ascertain quickly the subject matter of the technical disclosure and is not be used to interpret or limit the scope or meaning of the claims.

22 Claims, 2 Drawing Sheets

RETAINER CLIP

BACKGROUND OF THE INVENTION

1. Field of the Invention

The present intention relates to a retainer clip and, more particularly, to a retainer clip that secures a battery to an electronic device.

2. Background

Batteries are regularly used as a convenient source of power in electronic devices because of their small size, ease of use, and low maintenance. For example, batteries are often used in computers and servers to support certain functions of the particular devices. Specifically, batteries are regularly connected to multi-function computer cards, such as printed circuit boards ("PCBs"), to support clock functions and back-up functions of a device, even when the particular device is not otherwise powered. Such a battery should be firmly secured to the PCB to ensure reliable connection to the electrical circuit. However, because of the limited area available on a PCB to secure a battery, the securing apparatus must occupy as small amount of space as possible.

Several methods have been used to secure batteries to PCBs, including soldering, spot welding, taping, and holders. Each of these securing techniques, however, has drawbacks.

SUMMARY OF THE INVENTION

The present invention is directed to a device that secures a battery to an electronic component and method of performing the same. One exemplary embodiment of the present invention comprises a retainer clip that includes at least three arms, each having a free end and an intersecting end. For the three arms, the respective intersecting ends join together at an intersecting point and the opposed free ends are adapted to couple to the electronic device. When the retainer clip is coupled to the electronic device, the intersecting point is spaced apart from the component at a distance to receive a battery therebetween. The battery is then movable between a separated position, in which the battery is spaced apart from the intersecting point, and a mounted position, in which the battery is disposed intermediate the intersecting point and the electronic device.

To secure better the battery, the retainer clip preferably urges the intersecting point toward the electronic device. In one exemplary embodiment, the intersecting point is bendable and is normally concave in side view. When the battery is moved or slid to the mounted position, at least a portion of the intersecting point flexes to be substantially straight. Since the intersecting point is biased to be concave, it more securely positions the battery than an embodiment that is not predisposed to be concave.

DETAILED DESCRIPTION OF THE INVENTION

The present invention is more particularly described in the following examples that are intended as illustrative only since numerous modifications and variations therein will be apparent to those skilled in the art. As used in the specification and in the claims, "a," "an," or "the" can mean one or more, depending upon the context in which it is used. The preferred embodiment is now described with reference to the figures, in which like numbers indicate like parts throughout the figures.

Figure 1:
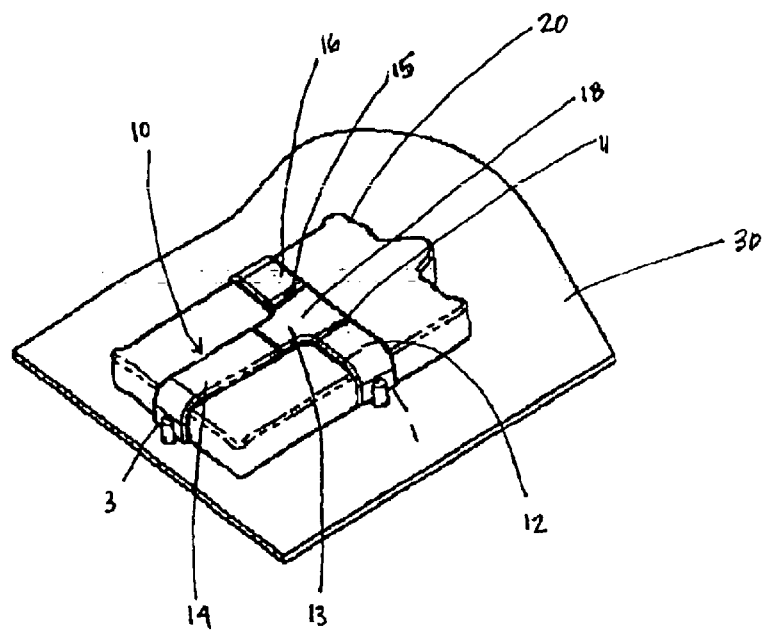
FIG. 1 is a perspective view of a retainer clip, battery, and PCB, wherein the battery is in the mounted position and secured to the PCB by the retainer clip coupled to the PCB.
Figure 4:
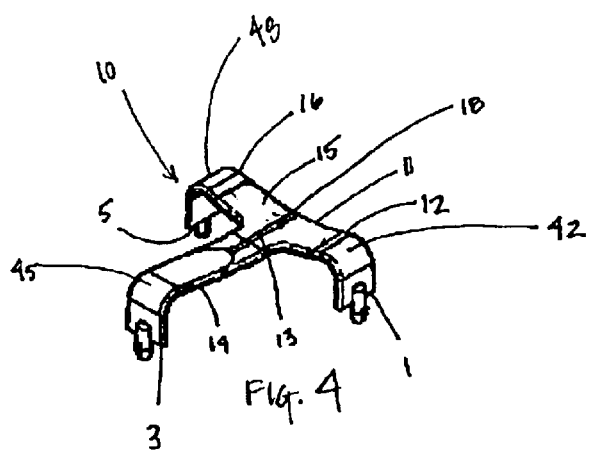
FIG. 4 is a top perspective view of the retainer clip.

Referring to the drawings, FIG. 1 illustrates one exemplary embodiment of a retainer clip 10 of the present invention shown securing a battery 20 to a printed circuit board ("PCB") 30. One skilled in the art will appreciate, however, that the retainer clip 10 may secure the battery 20 to other electronic devices, such as electronic cards and chassis, but the exemplary embodiment is discussed in the context of a PCB for convenience and continuity.

The retainer clip 10 preferably comprises at least three arms, namely, a first arm 12, a second arm 14, and a third arm 16. Each of the respective arms includes opposed ends—an intersecting end and a free end. The intersecting end 11 of the first arm 12, the intersecting end 13 of the second arm 14, and the intersecting end 15 of the third arm 16 join together at an intersecting point 18. The intersecting ends are preferably integrally formed together at the intersecting point 18, but, if desired, may be connected together after they are manufactured.

The free end 1 of the first arm 12, the free end 3 of the second arm 14, and the free end 5 of the third arm 16 couple to the PCB 30. As shown best in FIG. 2, the free ends 1, 3, and 5 have tabs 2, 4, and 6 that are complementarily received into holes 32, 34, and 36, respectively, in the PCB 30 and then expand to detachably "lock" into position. The tabs 2, 4, and 6 in the exemplary embodiment are designed to engage a PCB with thickness of 0.062 inches +/−0.04 inches. Other designs are contemplated to couple the respective free ends to the holes in or surface of the PCB, including using fusing, soldering, spot welding, chemical adhesives, or other mechanical systems, such as the tip of the free end having threads that complementarily engage a nut or the like on the opposite side of the PCB.

Figure 2:
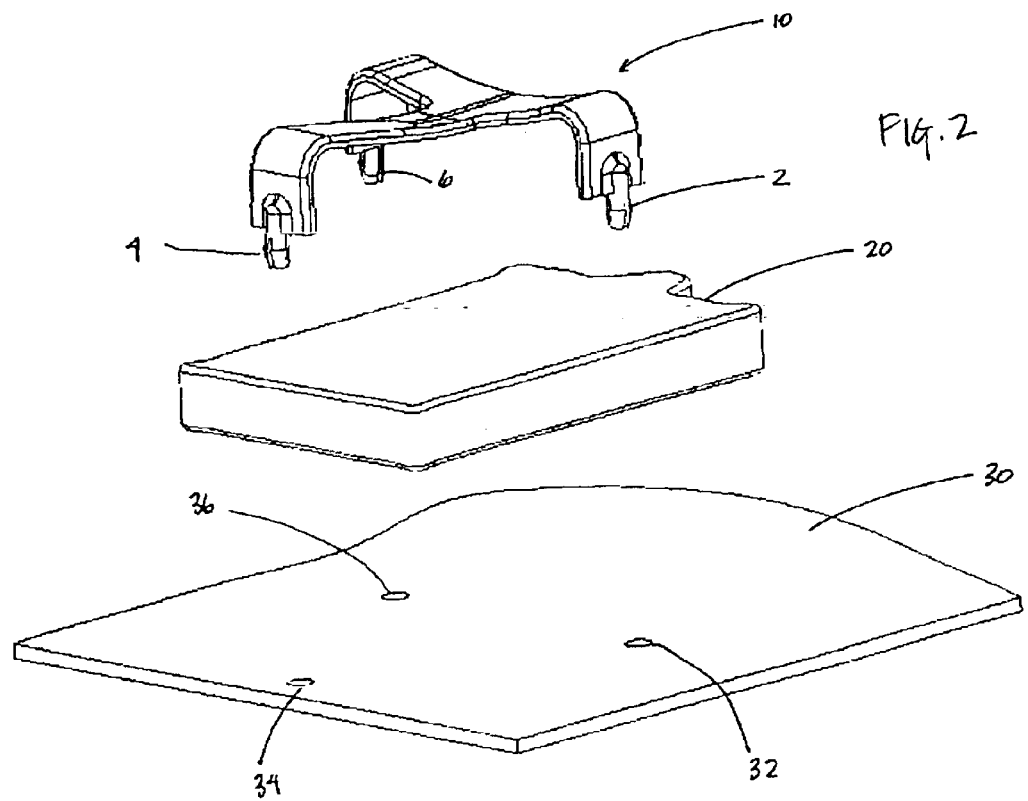
FIG. 2 is an exploded perspective of the retainer clip, battery, and PCB.
Figure 3:
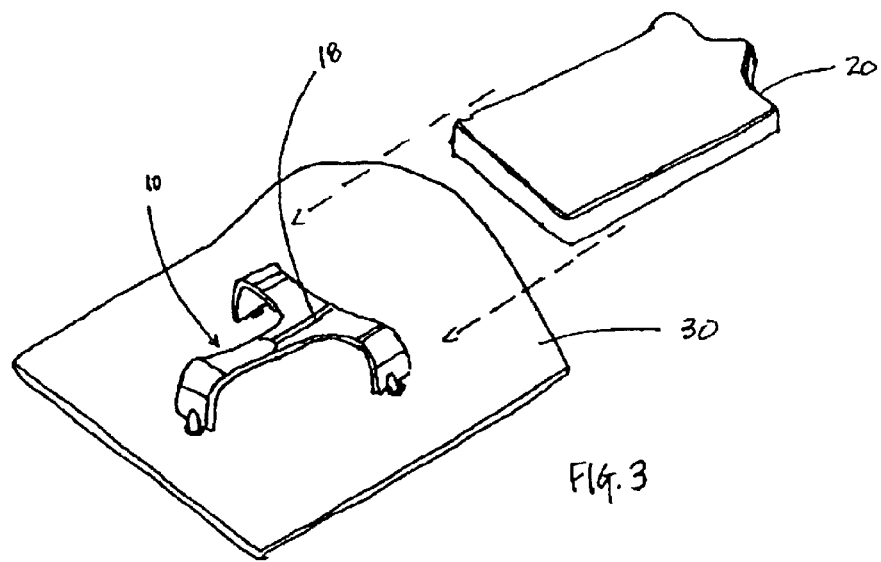
FIG. 3 is a perspective view of the retainer clip, battery, and PCB, wherein the battery is in the separated position and spaced apart from the retainer clip and PCB.

As shown in FIGS. 1–5, moving away from the intersecting point 18, the three arms 12, 13, and 14 of the retainer clip 10 are spaced apart to form a "T" shape in plan view in the exemplary embodiment. This "T" shape is preferred for receiving a battery 20 that is substantially rectangular in plan view, as shown in FIGS. 1–3. Other shapes of the retainer clip 10 are contemplated, particularly if the clip uses more than three arms (not shown).

Furthermore, the retainer clip may include additional segments (not shown) that additionally support the battery. As an example, such a segment may extend from the intersection point 18 in a direction away from the second arm 14 and not have a free end that couples to the PCB. This segment would provide supplemental support for retaining the battery 20 in position.

The retainer clip 10 of the present invention may be designed to accept batteries 20 having different dimensions, such as varying widths and thicknesses. This is achieved by varying the distance between the free ends 1, 2, and 3 to accommodate batteries of different widths and lengths and altering the spacing between the surface of the PCB and the intersecting point 18 to accept batteries of different thicknesses. Moreover, the retainer clip of the present invention may further be designed to receive batteries having different shapes, such as circular, elliptical, tetragonal, polygonal, and the like.

Figure 5:
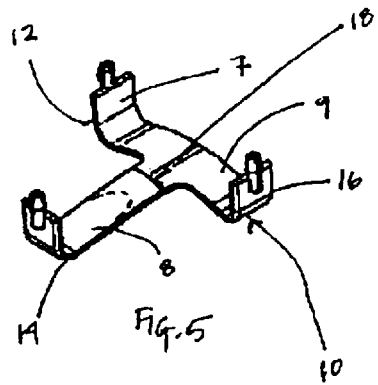
FIG. 5 is a bottom perspective view of the retainer clip.

When the retainer clip 10 is coupled to the PCB 30, the battery 20 is movable or slidable between a separated position and a mounted position. In the separated position, the battery 20 is spaced apart from intersecting point 18 and PCB 30, as shown in FIG. 3. In comparison, FIG. 1 shows the battery in the mounted position, in which battery 20 is disposed intermediate intersecting point 18 and PCB 30. Referring now to FIGS. 1 and 5, the interior surfaces 7, 8, and 9 of the respective arms 12, 14, and 16 of the retainer clip 10 contact portions of battery 20 when the battery 20 is in the mounted position.

It is preferred that the retainer clip 10 further comprises a means for biasing or urging the intersection point 18 toward the PCB or other component to which the clip 10 is coupled. Thus, when the battery 20 is in the mounted position, the intersecting point 18 of the retainer clip 10 exerts a compressive force on the battery 20 to hold it in position more securely. This compressive force hinders the battery 20 from shifting or becoming dislodged when the PCB 30 is installed onto the electronic equipment or when the battery and its surrounding components are subject vibrations during operations.

As shown best in FIGS. 2–5, the first arm 12 of the retainer clip 10 has a bend 42 located intermediate its intersecting end 11 and free end 1. The second arm 14 similarly has a bend 45 located intermediate its intersecting end 13 and free end 3 and the third arm 16 likewise has a bend 48 intermediate its intersecting and free ends 15, 5. Thus, in the exemplary embodiment, the intersecting point 18 is located below a horizontal plane defined by tangentially contacting the bends 42, 45, and 48 and, more specifically, the intersecting point 18 is concave in side view when the battery 20 is in the separated position. As one skilled in the art will appreciate, however, the term "concave" is not limited to a smooth arcuate shape, but encompasses any design in which at least a portion of the intersecting point drops downwardly toward the tips of the free ends 1, 3, and 5 of the retaining clip 10.

When the operator moves or slides the battery 20 to the mounted position, the intersecting point 18 may be bent or flexed to be substantially straight to allow the battery 20 to be received intermediate the PCB 30 and portions of the interior surfaces 7, 8, and 9 of the respective arms 12, 14, and 16. Thus, when the battery 20 is in the mounted position, the intersecting point 18 is urged back to its normally concave position, which more securely holds the battery 20 in the mounted position. That is, the battery 20 is "sandwiched" between the intersecting point 18 and the component to which the retainer clip 10 is mounted because the intersecting point 18 is urged or biased toward the battery 20, and this design more securely retains the battery 20 in the mounted position.

The retainer clip 10 is preferably formed of a bendable material such as plastic. Plastic is also advantageous when the retainer clip 10 is used in conjunction with the PCB 30 or other electronic component because it is non-conductive. Examples of plastics that may be used to form the retainer clip include, but are not limited to, ABS and nylon.

The present invention, however, also contemplates the retainer clip 10 being formed of a metal or elastomeric material, either alone or in combination with each other or plastic. More specifically, a leaf spring may be used to form the biasing means. In still another design, it is contemplated that at least portions of the retainer clip 10 be formed of a "memory" material, such as the metal alloy nitinol, that can be bent to a given position for moving the battery into the mounted position and then can be made to return to its normal position that better holds the battery 20 in place.

Although the present invention has been described with reference to specific details of certain embodiments thereof, it is not intended that such details should be regarded as limitations upon the scope of the invention except as and to the extent that they are included in the accompanying claims. For example, the retainer clip of the present invention may be used outside of the context of electronics or computers and may be used to hold components other than batteries.

What is claimed is:

1. A retainer clip comprising:

at least three arms, each arm having a free end and an intersecting end, wherein the intersecting ends of the arms are joined together at an intersecting point, the free ends of the at least three arms adapted to couple to an electronic device; and means for biasing the intersecting point toward the electronic device, wherein the free ends of the respective arms are spaced apart to receive a battery therebetween, the battery movable between a separated position, in which the battery is spaced apart from the intersecting point, and a mounted position, in which the battery is disposed intermediate the intersecting point and the electronic device.

2. The retainer clip of claim 1, wherein the retainer clip is integrally formed.

3. The retainer clip of claim 1, wherein the free ends of the at least three arms further comprise tabs adapted to couple the retainer clip to the electronic device.

4. The retainer clip of claim 1, wherein the arms are made of a plastic that is bendable.

5. The retainer clip of claim 1, wherein the at least three arms form a "T" shape in plan view.

6. The retainer clip of claim 1, wherein the biasing means comprises the intersecting point normally being concave in side view, wherein at least a portion of the intersecting point is bendable to be substantially straight.

7. The retainer clip of claim 1, wherein the arms further comprise an interior surface that contacts a portion of the battery when the battery is in the mounted position.

8. A retainer clip comprising:

at least three arms, each arm having a free end and an intersecting end, wherein the intersecting ends of the arms are joined together at an intersecting point, the free end of the at least three arms adapted to couple to an electronic device, wherein the intersecting point is normally concave in side view, the engaging portion bendable to be substantially straight, wherein the free ends of the respective arms are spaced apart to receive a battery therebetween, the battery movable between a separated position, in which the battery is spaced apart from the intersecting point and in which the engaging portion of the intersecting point is concave, and a mounted position, in which the battery is disposed intermediate the intersecting point and the electronic device and in which the intersecting point is substantially straight.

9. The retainer clip of claim 8, wherein the retainer clip is integrally formed.

10. The retainer clip of claim 8, wherein the free ends of the at least three arms further comprise tabs adapted to couple the retainer clip to the electronic device.

11. The retainer clip of claim 8 wherein the arms are formed of a plastic that is bendable.

12. The retainer clip of claim 8, wherein the at least three arms form a "T" shape in plan view.

13. The retainer clip of claim 8, wherein the arms further comprise an interior surface that contacts a portion of the battery when the battery is in the mounted position.

14. A retainer clip comprising:

at least three arms, each arm having a free end and an intersecting end, wherein the intersecting ends of the arms are joined together at an intersecting point, the free end of the at least three arms adapted to couple to an electronic device;

means for biasing the intersecting point toward the electronic device; and a battery, wherein the free ends of the respective arms are spaced apart to receive the battery therebetween, the battery movable between a separated position, in which the battery is spaced apart from the intersecting point, and a mounted position, in which the battery is disposed intermediate the intersecting point and the electronic device.

15. The retainer clip of claim 14, wherein the retainer clip is integrally formed.

16. The retainer clip of claim 14, wherein the free ends of the at least three arms further comprise tabs adapted to couple the retainer clip to the electronic device.

17. The retainer clip of claim 14, wherein the at least three arms are formed of a plastic that is bendable.

18. The retainer clip of claim 14, wherein the arms form a "T" shape in plan view.

19. The retainer clip of claim 14, wherein the biasing means comprises the intersecting point normally being concave in side view, wherein at least a portion of the intersecting point is bendable to be substantially straight.

20. The retainer clip of claim 14, wherein the arms further comprise an interior surface that contacts a portion of the battery when the battery is in the mounted position.

21. The retainer clip of claim 14, wherein the battery is slidably movable along the electronic device between the mounted and separated positions.

22. The retainer clip of claim 14, wherein the battery is substantially rectangular in plan view.

\* \* \* \* \*